(12) United States Patent
Ye

(10) Patent No.: US 6,316,960 B2
(45) Date of Patent: *Nov. 13, 2001

(54) DOMINO LOGIC CIRCUIT AND METHOD

(75) Inventor: Yibin Ye, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,914

(22) Filed: Apr. 6, 1999

(51) Int. Cl.[7] ................................. H03K 19/096

(52) U.S. Cl. ............................. 326/95; 326/98

(58) Field of Search ................. 326/17, 22, 23, 326/24, 93, 95, 98, 83, 112, 119, 121

(56) References Cited

U.S. PATENT DOCUMENTS

| | | | |
|---|---|---|---|
| 4,571,510 | * 2/1986 | Seki et al. | 307/449 |
| 5,115,150 | * 5/1992 | Ludwig | 307/475 |
| 5,453,708 | 9/1995 | Gupta et al. | 326/98 |
| 5,543,735 | 8/1996 | Lo | 326/93 |
| 5,568,062 | 10/1996 | Kaplinsky | 326/27 |
| 5,661,675 | 8/1997 | Chin et al. | 364/768 |
| 5,671,151 | 9/1997 | Williams | 364/489 |
| 5,748,012 | 5/1998 | Beakes et al. | 326/93 |
| 5,796,282 | 8/1998 | Sprague et al. | 327/210 |
| 5,815,005 | * 9/1998 | Bosshart | 326/95 |
| 5,825,208 | 10/1998 | Levy et al. | 326/98 |
| 5,831,990 | 11/1998 | Queen et al. | 371/22.1 |
| 5,852,373 | 12/1998 | Chu et al. | 326/98 |
| 5,889,417 | * 3/1999 | Klass et al. | 326/98 |
| 5,892,372 | 4/1999 | Ciraula et al. | 326/96 |
| 5,896,046 | 4/1999 | Bjorksten et al. | 326/98 |
| 5,896,399 | 4/1999 | Lattimore et al. | 371/21.1 |
| 5,898,330 | 4/1999 | Klass | 327/210 |
| 5,917,355 | 6/1999 | Klass | 327/208 |
| 5,942,917 | 8/1999 | Chappell et al. | 326/121 |
| 6,002,292 | 12/1999 | Allen et al. | 327/379 |
| 6,049,231 | 4/2000 | Bosshart | 326/98 |
| 6,052,008 | 4/2000 | Chu et al. | 327/200 |
| 6,060,910 | 5/2000 | Inui | 326/98 |
| 6,087,855 | 7/2000 | Frederick, Jr. et al. | 326/106 |
| 6,108,805 | 8/2000 | Rajsuman | 714/724 |
| 6,133,759 | 10/2000 | Beck et al. | 326/98 |

FOREIGN PATENT DOCUMENTS

| | | | |
|---|---|---|---|
| 0954101 | 3/1999 | (EP) | H03K/19/096 |
| 04-239221 | 8/1992 | (JP) | H03K/19/096 |

OTHER PUBLICATIONS

Thompson, S., et al., "Dual Threshold Voltages and Substrate Bias: Keys to High Performance, Low Power, 0.1 μm Logic Designs", 1997 Symposium on VLSI Technology Digest of Technical Papers, 69–70, (1997).

(List continued on next page.)

Primary Examiner—Michael Tokar
Assistant Examiner—Anh Tran
(74) Attorney, Agent, or Firm—Schwegman, Lundberg, Woessner & Kluth, P.A.

(57) ABSTRACT

A domino logic circuit includes input connections to receive a clock signal and an input data signal. In one embodiment, the domino logic circuit includes a dynamic stage comprising at least one n-channel pull-up transistor having a gate coupled to receive the input data signal. The n-channel pull-up transistor has a low threshold voltage. The dynamic stage can include an n-channel pull-down transistor which has a gate connection coupled to receive the clock signal. First and second inverter circuits can also be provided to latch a voltage on a drain of the pull-down transistor. Static logic circuits coupled to the dynamic stage have skewed rise and fall times to increase the propagation time of the domino circuit.

14 Claims, 3 Drawing Sheets

OTHER PUBLICATIONS

Bryant, R. E., "Graph–Based Algorithms for Boolean Function Manipulation", *IEEE Transactions on Computers,* C–35 (8), 677–691, (1986).

Chakradhar, S.T., et al., "An Exact Algorithm for Selecting Partial Scann Flip–Flops", Proceedings, 31st Design Automation Conference, San Diego, California, 81–86, (1994).

Chakravarty, S., "On the Complexity of Using BDDs for the Synthesis and Analysis of Boolean Circuits", 27th Annual Allerton Conference on Communication, Control, and Computing, Allerton House, Monticello, Illinois., 730–739, (1989).

Patra. P., et al., "Automated Phase Assignment for the Synthesis of Low Power Domino Circuits", Proceedings of the 36th ACM/IEEE Conference on Design Automation Conference, 379–384, (1999).

Puri, et al., "Logic Optimization by Output Phase Assignment in Dynamic Logic Synthesis", International Conference on Computer Aided Design, (1996).

* cited by examiner

DOMINO LOGIC CIRCUIT AND METHOD

TECHNICAL FIELD OF THE INVENTION

The present invention relates generally to logic circuitry and in particular the present invention relates to logic circuitry having dynamic pull-down circuitry.

BACKGROUND OF THE INVENTION

In the field of semiconductor devices, the frequency of operation of the devices is constantly increasing. For clocked logic devices, therefore, signal evaluation time is decreasing. That is, the time allotted for a logic input to propagate to a logic output is decreasing. Domino circuits are used in integrated circuits to speed operating time. In a domino circuit, data is received on a first transition of a clock, and the signal is coupled to other circuitry on a next transition of the clock.

Conventional domino circuitry includes dynamic circuitry coupled to static gate circuits. The dynamic circuitry pre-charges an input of the static circuitry when a clock signal is low, and couples an input data signal to the static circuitry when the clock signal is high. The dynamic circuitry includes n-type metal oxide semiconductor (NMOS) pull-down circuitry. If the NMOS pull-down circuitry comprises low threshold voltage transistors, the domino circuitry is susceptible to noise.

For the reasons stated above, and for other reasons stated below which will become apparent to those skilled in the art upon reading and understanding the present specification, there is a need in the art for a domino circuit which has adequate noise margin even when low threshold voltage transistors are used.

SUMMARY OF THE INVENTION

In one embodiment, a domino logic circuit is coupled to receive a clock signal and an input data signal. The domino logic circuit includes a dynamic stage comprising at least one n-channel pull-up transistor having a gate coupled to receive the input data signal, and having a threshold voltage which is less than 0.3 volts.

In another embodiment, a circuit comprises an n-channel pull-down transistor coupled between an output node and a low voltage connection. A gate connection of the n-channel pull-down transistor is coupled to receive a clock signal. A first inverter circuit has an input connection coupled to the output node and an output connection coupled to an input connection of a second inverter circuit. The second inverter circuit has an output connection coupled to the output node. A pull-up n-channel transistor is provided which has a drain connected to an upper voltage node and a source coupled to the output node. A gate connection of the pull-up n-channel transistor is coupled to receive an input data signal. The pull-up n-channel transistor has a threshold voltage which is less than 0.3 volts.

DETAILED DESCRIPTION OF EMBODIMENTS OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
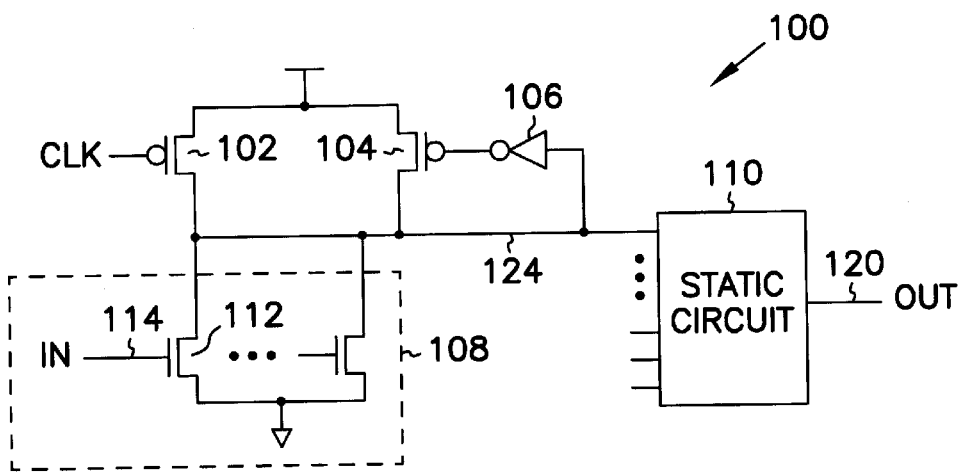
FIG. 1 is a schematic diagram of a prior art domino circuit.

A conventional domino logic circuit 100 is illustrated in FIG. 1. The domino circuit comprises two stages, a dynamic stage and a static stage. The dynamic stage includes a pull-up p-channel field effect transistor (PFET) 102, p-channel FET 104 and inverter 106. PFETs can be formed as metal oxide semiconductors. Transistor 102 is operated in response to a clock signal (CLK), such that the transistor is active when the clock signal is low. Transistor 104 is activated in response to a low gate voltage produced by inverter 106. Transistor 104 and inverter 106, therefore, operate as a latch circuit to maintain a high pre-charge voltage on node 124. A pull-down circuit 108 is coupled to node 124 to selectively couple node 124 to a low voltage (VSS) in response to input data signals.

As shown in FIG. 1, a pull-down circuit can comprise a plurality of n-channel FETs 112 which can be selectively activated in response to input data signals provided on the transistor gate connections 114. In operation, when the clock signal is low, node 124 is pre-charged to VCC through transistor 102 and is maintained at VCC via transistor 104. When the clock signal has a high voltage, transistor 102 is not active and transistors 112 can pull node 124 to VSS in response to a high voltage on an input connection 114. The domino circuit includes a static circuit 110 which provides an output signal on node 120. The static circuit can comprise any variety of complementary metal oxide (CMOS) circuits. It is common to use a CMOS logic circuit such as an inverter or NAND gate which inverts a voltage provided on node 124. It will be appreciated by those skilled in the art that domino circuit 100 can be highly susceptible to noise present on input connections 114 when n-channel transistors 112 have a low threshold voltage, Vt. The noise susceptibility problem will be explained in greater detail below.

It is noted that this domino circuit receives an input signal that is low when the clock signal is low. To prevent contention between transistors 102 and 112. Output 120 can be coupled to an input connection 114 of a subsequent domino circuit. Because output 120 is an inverted voltage from node 124, the input of the subsequent domino circuit is low during the pre-charge phase.

Figure 2:
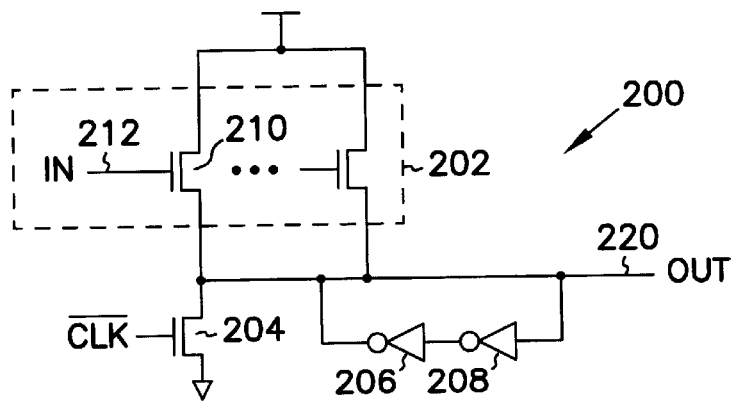
FIG. 2 is a schematic diagram of a single domino circuit according to one embodiment of the present invention.

FIG. 2 illustrates a first stage of a domino circuit 200 according to one embodiment of the present invention. The domino circuit includes an n-channel pull-down transistor 204, series coupled inverters 206 and 208, and pull-up circuit 202. The pull-up circuit comprises one or more n-channel pull-up transistors 210. Transistors 210 are fabricated such that they have a relatively low threshold voltage. It is contemplated that the pull-up transistors have a low threshold voltage. For example, the low threshold voltage can be considered to be one that is less than 0.3 volts. In one embodiment the threshold voltage can be in the range of 0.2 to 0.3 volts. Conversely, conventional n-channel transistor threshold voltages tend to above 0.3 volts. It will be appreciated, however, that one embodiment of the present invention can include transistors having a threshold voltage above 0.3 volts, but still considered low. In operation, pull-down transistor 204 is activated when the clock signal is low (/CLK is high). As such, node 220 is pulled low to a pre-discharge state of VSS. Inverters 206 and 208 are coupled to latch a voltage on node 220.

Figure 3:
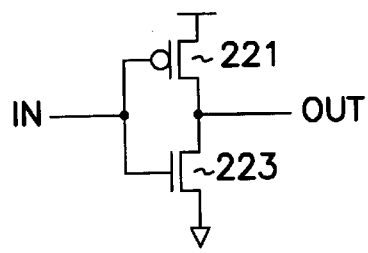
FIG. 3 illustrates an inverter circuit for use in the circuit of FIG. 2.

When the clock signal is high, transistor 204 is not activated and pull-up transistors 210 can pull node 220 toward VCC. It will be appreciated, however, that node 220 cannot reach VCC through transistors 210, but is limited by a threshold voltage to VCC-Vt. To drive node 220 to VCC, inverter 206 is provided. That is, inverter 206 can be fabricated using series coupled transistors 221 and 223, as illustrated in FIG. 3. P-channel transistor 221, therefore, pulls node 220 to VCC. It should be noted, that node 220 will remain at VSS if the pull-up circuit 202 is not activated.

As stated above, the conventional domino circuit illustrated in FIG. 1 is typically implemented with two stages, the dynamic stage and a static stage. As explained, the dynamic stage provides an output signal on node 124 which transitions from VCC to VSS in response to an input data signal. The static circuit 110 inverts this signal to provide an output signal on node 120 which transitions from VSS to VCC. The domino circuit of the present invention can be implemented as either a one stage circuit as illustrated in FIG. 2, or a three-stage circuit as illustrated in FIG. 4.

Figure 4:
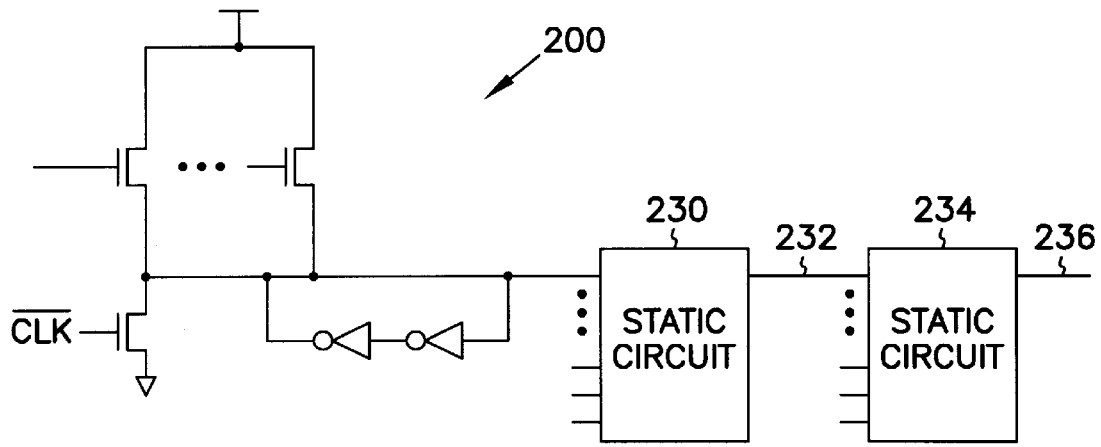
FIG. 4 is a schematic diagram of a three-stage domino circuit.
Figure 5:
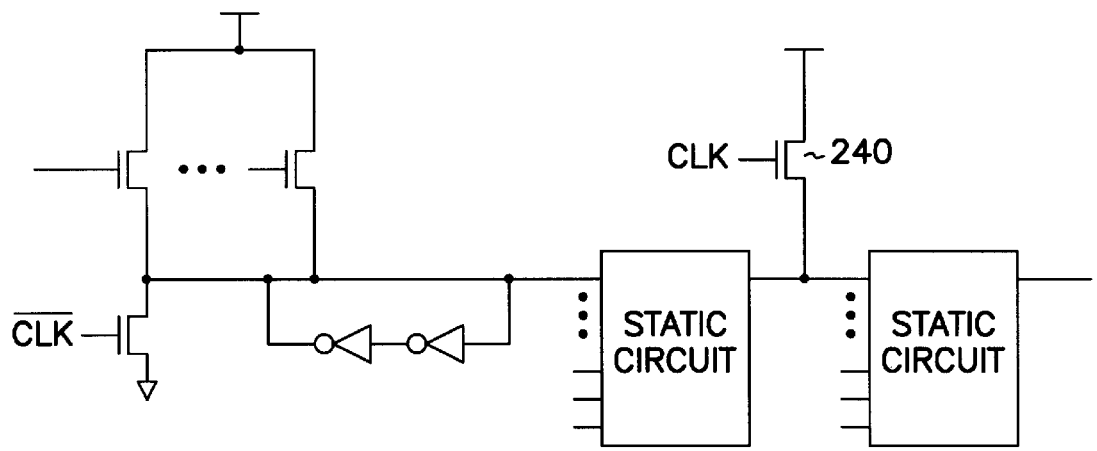
FIG. 5 is a schematic diagram of an alternate three stage domino circuit.

Referring to FIG. 4, the domino circuit is illustrated which includes a dynamic circuit 200, a first static circuit 230 and a second static circuit 234. The static circuits include MOS logic gates, including but not limited to inverters, NANDs and NORs. It will be appreciated than any type, or combination, of static circuit can be provided which inverts a signal provided on an input node. The first static circuit can be fabricated such that it is skewed for fast fall transitions. That is, the static circuit is fabricated having large NMOS pull-down devices, and small PMOS pull-up devices. The amount of skewing is not critical, but is primarily limited by a noise margin requirement. The second static circuit can be skewed for fast rise times (large pull-up devices and small pull-down devices). In one embodiment, the first static circuit is highly skewed and the second static circuit is less aggressively skewed in order to block noise from propagating into following stages. It is noted that as the first static circuit is skewed for fast fall times, the rise of its output node is relatively slow in the pre-discharge phase. As such, an optional pull-up transistor 240 can be provided between the first and second static circuits, as illustrated in FIG. 5.

It is noted that domino circuit 200 receives an input signal at 212 that is low when the clock signal is low (/CLK high). This prevents contention between the transistors 210 and 204. Intermediate node 220 can be coupled to an input connection 212 of a subsequent domino dynamic circuit. The input data signal of the subsequent domino circuit, therefore, has a low state during the pre-discharge phase. To maintain this relationship, two static stages are coupled in series to node 220, FIG. 4. The output of circuit 234 can be coupled to an input of a subsequent domino circuit without concern of contention. The domino circuitry of FIGS. 2, 4 and 5 are compatible with the circuitry of FIG. 1. Thus, the present invention can be provided in an integrated circuit which has conventional domino circuitry.

Figure 6:
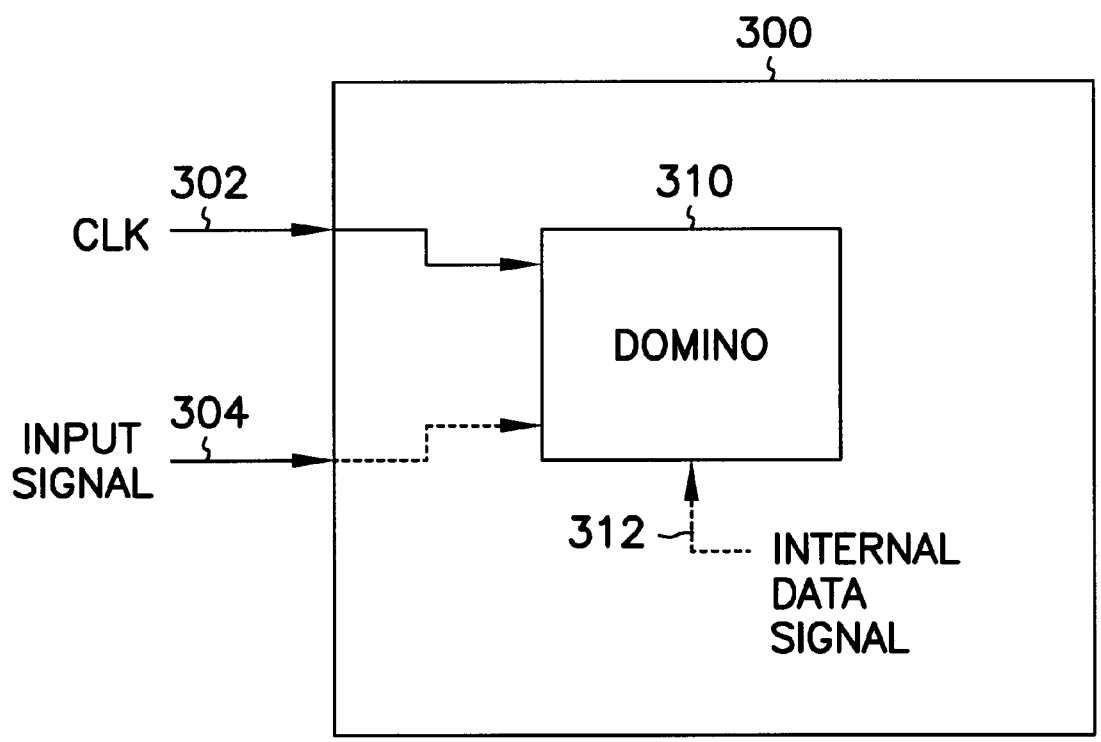
FIG. 6 is a block diagram of an integrated circuit according to one embodiment of the present invention.

FIG. 6 illustrates a block diagram of an integrated circuit 300 of the present invention. The integrated circuit receives a clock signal 302, and at least one input data signal 304. The input data signal can be coupled to an internal domino circuit 310 for processing by internal circuitry. Again, the domino circuit can alternately process an internal data signal 312. The domino circuit can be arranged as described above with reference to FIGS. 2 through 5. The integrated circuit can be any type of integrated circuit, including but not limited to a processor, memory, memory controller or application-specific integrated circuit (ASIC). While the present invention is illustrated as receiving an inverse clock signal for operating the pull-down circuitry, it will be appreciated that the terms clock signal and inverse clock signal merely refer to relative logic states, and can be used interchangeably. For the purpose of the present invention, the pull-down transistor is activated when a voltage on its gate connection is a threshold voltage above its source voltage, regardless of the terminology used to describe the gate signal. As such, the domino circuit performs a pre-discharge operation when the clock signal on the pull-down transistor is high, and performs an evaluation operation of an input data signal when the clock signal is low. The input data signal can be an externally provided input signal, an output signal from a previous domino circuit, or any other internal signal. To avoid contention between the pull-up and pull-down transistors during the pre-discharge stage, the data signal should be low during this phase.

One advantage of the low threshold voltage NMOS circuitry described above, is the higher noise tolerance of the resultant domino logic circuitry. To illustrate the improved noise margin, a comparison of the domino circuitry of FIGS. 1 and 2 is provided. It is assumed that the n-channel pull-down transistors 112 have a low threshold voltage, and that the n-channel pull-up transistors 210 also have a low threshold voltage. Referring to the prior art domino circuit 100, a large leakage current is experienced through pull-down transistors 112 when noise is present on the gates 114 of pull-down transistors 112. The peak leakage current is defined by:

$$I_{leakage} \propto e^{\frac{(V_{gs}-V_t)}{S}} = e^{\frac{(\Delta V1-V_t)}{S}}$$

where $\Delta V1$ is the noise present on gate 114, S is a variable that is proportional to temperature and Vt is the threshold voltage of the pull-down transistors. It will be appreciated that as the threshold voltage decreases the effect of noise increases exponentially. To prevent the pre-charge voltage provided on the dynamic node 124 from dropping too low, a large p-channel latch transistor 104 is required. By increasing the size of this transistor, however, unfavorable circuit performance results. That is, a larger contention current between transistor 104 and pull-down transistors 112 increases the evaluation delay experienced on node 124. As a result, to maintain adequate speed and noise margin, pull-down transistors 112 must maintain higher threshold voltages.

Referring to FIG. 2, when $\Delta V1$ noise (positive voltage) is present on input 212, pull-up transistor 210 begins to conduct. As a result, node 220 is pulled up by a voltage level ΔV2. The increase in voltage at node 220, however, reduces the source-to-gate voltage of the pull-up n-channel transistors 210. The leakage current through the pull-up transistors decreases as ΔV2 increases. This self-debiasing leakage characteristic can be understood by the following equation:

$$I_{leakage} \propto e^{\frac{(V_{gs}-V_t)}{S}} = e^{\frac{(\Delta V1 - \Delta V_2 - V_t)}{S}}$$

As a result, the leakage current is decreased with respect to circuit 100. Adequate noise margin can be maintained without high threshold voltage devices. Using lower threshold voltage devices improves circuit performance. For example, performance of devices with wide fan-in static circuit gates such as 32-bit OR gates is increased by using low threshold voltage devices.

Referring to FIG. 6, an integrated circuit 300 has been described which has a first input connection for receiving a clock signal, and a second input connection for receiving an input data signal. A domino logic circuit has been described which is coupled to the first input connection. In one embodiment, the domino logic circuit includes a dynamic stage comprising at least one n-channel pull-up transistor having a gate coupled to receive the input data signal, and having a threshold voltage which is less than 0.3 volts. The dynamic stage can include an n-channel pull-down transistor which has a gate connection coupled to receive the clock signal. First and second inverter circuits can be provided to latch a voltage on a drain of the pull-down transistor. Static logic circuits can be provided which have skewed rise and fall times to increase the propagation time of the domino circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A circuit comprising:
   an n-channel pull-down transistor coupled directly between an output node and a low voltage connection, a gate connection of the n-channel pull-down transistor is coupled to receive a clock signal;
   a first inverter circuit having an input connection coupled to the output node and an output connection coupled to an input connection of a second inverter circuit, the second inverter circuit has an output connection coupled to the output node;
   a pull-up logic circuit comprising at least one n-channel transistor having a drain connected to an upper voltage node and a source coupled to the output node, a gate connection of the pull-up n-channel transistor is coupled to receive an input data signal, the pull-up n-channel transistor has a threshold voltage which is less than 0.3 volts; and
   a second n-channel pull-up transistor coupled to an output connection of the logic circuit, a gate connection of the second n-channel pull-up transistor is coupled to receive an inverse clock signal.

2. A circuit comprising:
   an n-channel pull-down transistor coupled directly between an output node and a low voltage connection, a gate connection of the n-channel pull-down transistor is coupled to receive a clock signal;
   a first inverter circuit having an input connection coupled to the output node and an output connection coupled to an input connection of a second inverter circuit, the second inverter circuit has an output connection coupled to the output node;
   a pull-up logic circuit comprising at least one n-channel transistor having a drain connected to an upper voltage node and a source coupled to the output node, a gate connection of the pull-up n-channel transistor is coupled to receive an input data signal, the pull-up n-channel transistor has a threshold voltage which is less than 0.3 volts;
   a first logic circuit having an input connection coupled to the output node, the first logic circuit has an output connection and provides an output signal which has an inverse logic voltage signal of a voltage provided on the output node; and
   a second logic circuit having an input connection coupled to the output connection of the first logic circuit, the second logic circuit has an output connection and provides an output signal which has an inverse logic voltage signal of the output signal of the first logic circuit.

3. The circuit of claim 2 wherein the first logic circuit is skewed to provide a fast fall time in its output signal in response to the voltage provided on the output node.

4. The circuit of claim 2 wherein the second logic circuit is skewed to provide a fast rise time in its output signal in response to the output signal of the first logic circuit.

5. A circuit comprising:
   an n-channel pull-down transistor coupled between an output node and a low voltage connection, a gate connection of the n-channel pull-down transistor is coupled to receive a clock signal;
   a first inverter circuit having an input connection coupled to the output node and an output connection coupled to an input connection of a second inverter circuit, the second inverter circuit has an output connection coupled to the output node;
   a pull-up n-channel transistor having a drain connected to an upper voltage node and a source coupled to the ouput node, a gate connection of the pull-up n-channel transistor is coupled to receive an input data signal, the pull-up n-channel transistor has a threshold voltage which is less than 0.3 volts;
   a first logic circuit having an input connection coupled to the output node, the first logic circuit has an ouput connection and provides an output signal which has an inverse logic voltage signal of a voltage provided on the output node; and
   a second logic circuit having an input connection coupled to the output connection of the first logic circuit, the second logic circuit has an ouput connection and provides an output signal which has an inverse logic voltage signal of the output signal of the first logic circuit; and
   a second n-channel pull-up transistor coupled to the output connection of the first logic circuit, a gate connection of the second n-channel pull-up transistor is coupled to receive an inverse clock signal.

6. A circuit comprising:
   an n-channel pull-down transistor coupled directly between an output node and a low voltage connection, a gate connection of the n-channel pull-down transistor is coupled to receive a clock signal;

a first inverter circuit having an input connection coupled to the output node and an output connection coupled to an input connection of a second inverter circuit, the second inverter circuit has an output connection coupled to the output node;

a pull-up logic circuit comprising at least one n-channel transistor having a drain connected to an upper voltage node and a source coupled to the output node, a gate connection of the pull-up n-channel transistor is coupled to receive an input data signal, the pull-up n-channel transistor has a threshold voltage which is less than 0.3 volts;

a plurality of n-channel pull-up transistors coupled in parallel with the pull-up n-channel transistor, each one of the plurality of n-channel pull-up transistors has a gate connection coupled to receive different input data signals.

7. A domino logic circuit comprising:

an n-channel pull-down transistor coupled directly between an intermediate node and a low voltage connection, a gate connection of the n-channel pull-down transistor is coupled to receive a clock signal;

a first inverter circuit having an input connection coupled to the intermediate node and an output connection coupled to an input connection of a second inverter circuit, the second inverter circuit has an output connection coupled to the intermediate node;

a pull-up logic circuit comprising at least one pull-up n-channel transistor having a drain connected to an upper voltage node and a source coupled to the intermediate node, a gate connection of the pull-up n-channel transistor is coupled to receive an input data signal, the pull-up n-channel transistor has a threshold voltage which is less than 0.3 volts;

a first logic circuit having an input connection coupled to the intermediate node, the first logic circuit has an output connection and provides an output signal which has an inverse logic voltage signal of a voltage provided on the intermediate node; and a second logic circuit having an input connection coupled to the output connection of the first logic circuit, the second logic circuit has an output connection and provides an output signal which has an inverse logic voltage signal of the output signal of the first logic circuit.

8. The domino circuit of claim 7 wherein the first logic circuit is skewed to provide a fast fall time in its output signal in response to the voltage provided on the intermediate node.

9. The domino circuit of claim 7 wherein the second logic circuit is skewed to provide a fast rise time in its output signal in response to the output signal of the first logic circuit.

10. A domino logic circuit comprising:

an n-channel pull-down transistor coupled between an intermediate node and a low voltage connection, a gate connection of the n-channel pull down transistor is coupled to receive a clock signal;

a first inverter circuit having an input connection coupled to the intermediate node and an output connection coupled to an input connection of a second inverter circuit, the second inverter circuit has an output connection coupled to the intermediate node;

a first pull-up n-channel transistor having a drain connected to an upper voltage node and a source coupled to the intermediate node, a gate connection of the pull-up n-channel transistor is coupled to receive an input data signal, the first pull-up n-channel transistor has a threshold voltage which is less than 0.3 volts;

a first logic circuit having an input connection coupled to the intermediate node, the first logic circuit has an output connection and provides and ouput signal which has an inverse logic voltage signal of a voltage provided on the intermediate node;

a second logic circuit having an input connection coupled to the output connection of the first logic circuit, the second logic circuit has an output connection and provides an output signal which has an inverse logic voltage signal of the ouput signal of the first logic circuit; and a second n-channel pull-up transistor coupled to the output connection of the first logic circuit, a gate connection of the second n-channel pull-up transistor is coupled to receive an inverse of the clock signal.

11. The domino circuit of claim 7 further comprising a plurality of n-channel pull-up transistors coupled in parallel with the first pull-up n-channel transistor, each one of the plurality of n-channel pull-up transistors has a gate connection coupled to receive different input data signals.

12. An integrated circuit comprising:

a first input connection for receiving a clock signal;

a second input connection for receiving an input data signal; and a domino logic circuit coupled to receive the clock signal and input data signal, the domino logic circuit includes a dynamic stage comprising a pull-up logic circuit comprising at least one n-channel pull-up transistor having a gate coupled to receive the input data signal, and having a threshold voltage which is less than 0.3 volts;

first and second static logic circuits, the first logic circuit has an input connection coupled to the intermediate node, the first logic circuit has an output connection and provides an output signal which has an inverse logic voltage signal of a voltage provided on the intermediate node, and the second logic circuit has an input connection coupled to the output connection of the first logic circuit, the second logic circuit has an output connection and provides an output signal which has an inverse logic voltage signal of the output signal of the first logic circuit.

13. The integrated circuit of claim 12 wherein the first logic circuit is skewed to provide a fast fall time in its output signal in response to the voltage provided on the intermediate node, and the second logic circuit is skewed to provide a fast rise time in its output signal in response to the output signal of the first logic circuit.

14. The integrated circuit of claim 12 wherein the domino logic circuit comprises at least one static logic stage coupled to an output of the dynamic stage.

* * * * *